US012500098B2

(12) United States Patent
Sugita et al.

(10) Patent No.: US 12,500,098 B2
(45) Date of Patent: Dec. 16, 2025

(54) SUBSTRATE PROCESSING DEVICE, SUBSTRATE PROCESSING METHOD, AND METHOD FOR MANUFACTURING SEMICONDUCTOR DEVICE

(71) Applicant: KIOXIA CORPORATION, Tokyo (JP)

(72) Inventors: Tomohiko Sugita, Yokkaichi Mie (JP); Hiroshi Fujita, Mie Mie (JP); Tatsuhiko Koide, Kuwana Mie (JP)

(73) Assignee: Kioxia Corporation, Tokyo (JP)

( * ) Notice: Subject to any disclaimer, the term of this patent is extended or adjusted under 35 U.S.C. 154(b) by 523 days.

(21) Appl. No.: 17/682,745

(22) Filed: Feb. 28, 2022

(65) Prior Publication Data

US 2022/0406626 A1 Dec. 22, 2022

(30) Foreign Application Priority Data

Jun. 21, 2021 (JP) .................. 2021-102383

(51) Int. Cl.
H01L 21/67 (2006.01)
H01L 21/677 (2006.01)
H01L 21/311 (2006.01)

(52) U.S. Cl.
CPC .... H01L 21/67086 (2013.01); H01L 21/6708 (2013.01); H01L 21/67757 (2013.01); *H01L 21/31111* (2013.01)

(58) Field of Classification Search
CPC ......... C23C 16/45578; H01L 21/31111; H01L 21/67017; H01L 21/67057;
(Continued)

(56) References Cited

U.S. PATENT DOCUMENTS 5,292,373 A * 3/1994 Arita ................. H01L 21/02052
257/E21.228
5,730,162 A 3/1998 Shindo et al.
(Continued)

FOREIGN PATENT DOCUMENTS

JP H03266431 A 11/1991
JP H07176506 A 7/1995
(Continued)

OTHER PUBLICATIONS

Japanese Office Action dated Jan. 7, 2025, mailed in counterpart Japanese Application No. 2021-102383, 12 pages.

*Primary Examiner* — Benjamin Kendall
(74) *Attorney, Agent, or Firm* — Kim & Stewart LLP

(57) ABSTRACT

According to one embodiment, a substrate processing device includes a processing tank to store a liquid and to permit a plurality of substrates to be immersed in the liquid at the same time. The device also has a holder member configured to hold the plurality of substrates while the substrates are immersed into and withdrawn from the liquid in the processing tank as well as a straightening vane configured to be positioned in the liquid above the plurality of substrates in the processing tank. The straightening vane includes vane portions extending in a vertical direction into the processing tank that have a length in the vertical direction that is greater than a cross sectional width in a horizontal direction perpendicular to the vertical direction. A bubble discharge pipe is disposed in the processing tank below the holder member. The bubble discharge pipe discharges gas into the liquid.

16 Claims, 21 Drawing Sheets

(58) Field of Classification Search
CPC .......... H01L 21/67075; H01L 21/6708; H01L 21/67086; H01L 21/67757
See application file for complete search history.

(56) References Cited

U.S. PATENT DOCUMENTS

| | | | |
|---|---|---|---|
| 5,914,281 A | 6/1999 | Abe et al. | |
| 6,156,153 A * | 12/2000 | Iwamoto | H01L 21/67086 134/55 |
| 6,523,552 B2 * | 2/2003 | Pokorny | H01L 21/67057 134/182 |
| 9,318,358 B2 * | 4/2016 | Fischer | H01L 21/6704 |
| 11,309,194 B2 | 4/2022 | Tanaka | |
| 11,469,119 B2 | 10/2022 | Nakaoka | |
| 2002/0026729 A1 * | 3/2002 | Bergman | H01L 21/67028 34/410 |
| 2010/0031983 A1 * | 2/2010 | Ootaguro | H01L 21/67086 134/56 R |
| 2011/0053364 A1 * | 3/2011 | Murabe | H01L 21/32134 257/E21.477 |
| 2017/0309501 A1 | 10/2017 | Kitamura et al. | |
| 2018/0247841 A1 * | 8/2018 | Nagai | H01L 21/67253 |
| 2020/0211865 A1 * | 7/2020 | Otsu | B05B 12/1409 |
| 2021/0082728 A1 | 3/2021 | Kinoshita | |

FOREIGN PATENT DOCUMENTS

| | | |
|---|---|---|
| JP | H08195373 A | 7/1996 |
| JP | H0969510 A | 3/1997 |
| JP | 10135174 A * | 5/1998 |
| JP | H10135174 A | 5/1998 |
| JP | H11102888 A | 4/1999 |
| JP | 2002110607 A | 4/2002 |
| JP | 2017195338 A | 10/2017 |
| JP | 2018125516 A | 8/2018 |
| JP | 2020136537 A | 8/2020 |
| WO | 2021048983 A1 | 3/2021 |

* cited by examiner

FIG. 13
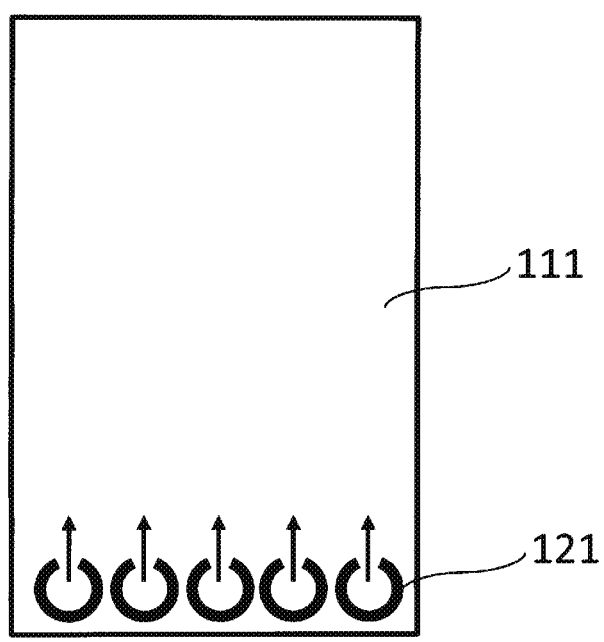
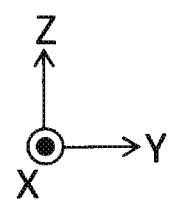

FIG. 15
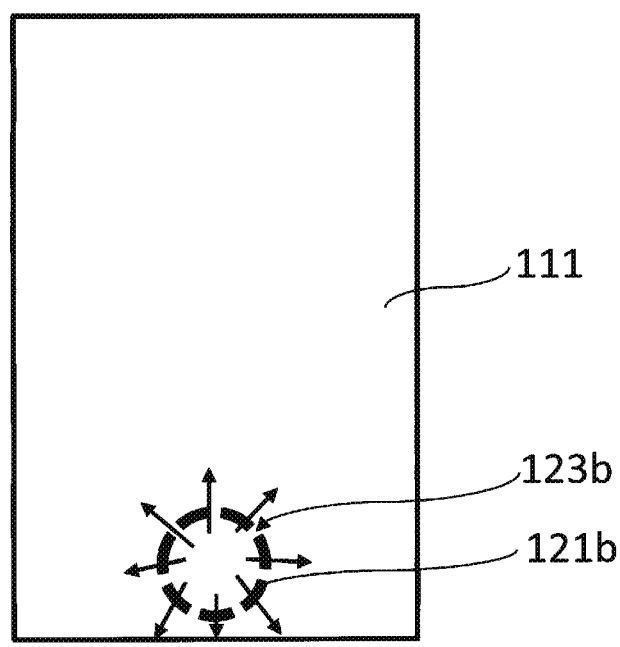
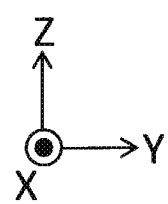

SUBSTRATE PROCESSING DEVICE, SUBSTRATE PROCESSING METHOD, AND METHOD FOR MANUFACTURING SEMICONDUCTOR DEVICE

CROSS-REFERENCE TO RELATED APPLICATION

This application is based upon and claims the benefit of priority from Japanese Patent Application No. 2021-102383, filed Jun. 21, 2021, the entire contents of which are incorporated herein by reference.

FIELD

Embodiments described herein relate generally to a substrate processing device, a substrate processing method, and a method for manufacturing a semiconductor device.

BACKGROUND

In some cases, a silicon nitride film is required to be selectively etched with respect to a silicon oxide film. On a substrate with a stacked body thereon in which silicon nitride films and silicon oxide films are alternately stacked, a phosphoric acid solution is generally used as an etching solution for etching of the silicon nitride film(s). In such etch processing, if a silicon compound is added to the phosphoric acid solution, the silica concentration in the phosphoric acid solution increases, and the selectivity with respect to the silicon oxide film can be further increased. However, if the silica concentration in the phosphoric acid solution is low, the selectivity of the silicon nitride film over the silicon oxide film may be low, and the silicon oxide film may be eroded. On the other hand, if the concentration of silica in the phosphoric acid solution is very high, the silica concentration may tend towards saturated during processing, and, as a result, silica may be unintentionally deposited on to substrate while in the phosphoric acid solution.

In order to control the silica concentration in the phosphoric acid solution, it is necessary to make the phosphoric acid solution uniform.

BRIEF DESCRIPTION OF THE DRAWINGS

FIG. 13 is a cross-sectional view schematically illustrating a chemical discharge pipe according to a modification example.

FIG. 15 is a cross-sectional view schematically illustrating a chemical discharge pipe according to a modification example.

DETAILED DESCRIPTION

Embodiments provide a substrate processing device, a substrate processing method, and a method for manufacturing a semiconductor device that improves the stirring efficiency of processing liquid.

In general, according to one embodiment, a substrate processing device includes a processing tank to store a liquid and to permit a plurality of substrates to be immersed in the liquid at the same time. A holder member is provided to hold the plurality of substrates while the substrates are immersed into and withdrawn from the liquid in the processing tank. A straightening vane is provided to be positioned in the liquid above the plurality of substrates in the processing tank. The straightening vane includes vane portions extending in a vertical direction into the processing tank and having a length in the vertical direction that is greater than a cross sectional width of the vane portions in a horizontal direction perpendicular to the vertical direction. A bubble discharge pipe is disposed in the processing tank below the holder member in the vertical direction. The bubble discharge pipe is configured to discharge gas into the liquid in the processing tank.

Hereinafter, a substrate processing device, a semiconductor manufacturing device, a substrate processing method, and a semiconductor device processing method according to certain example embodiments will be described with reference to drawings. In the following description, elements having substantially the same function and configuration are designated by the same reference symbol. Each of the depicted embodiments are presented for explaining certain technical concepts of present disclosure. The technical concepts are not limited to specifically described details of these example embodiments. Modifications, variations, and the like will be readily apparent to those of ordinary skill in the art.

The drawings are schematic and do not limit the present disclosure.

In the present specification, the expressions such as "α is A, B, or C", "α is any of A, B, and C", and "α is selected from a group including A, B and C" do not exclude cases where a is any combination of A, B, and C unless otherwise specified. Furthermore, expressions of this type do not exclude possibility where a includes other elements in addition to A, B, or C.

In the present specification, "horizontal" generally refers to being parallel to a bottom surface of an inner tank 111 and may be referred to as being an XY direction or in an XY plane. Relatedly, "vertical" refers to being substantially orthogonal to the bottom surface of the inner tank 111 and may be referred to as being in, or along, a Z direction.

In general, each of following embodiments may be combined with each other as long as there is no technical conflict in the combination.

First Embodiment

Figure 1:
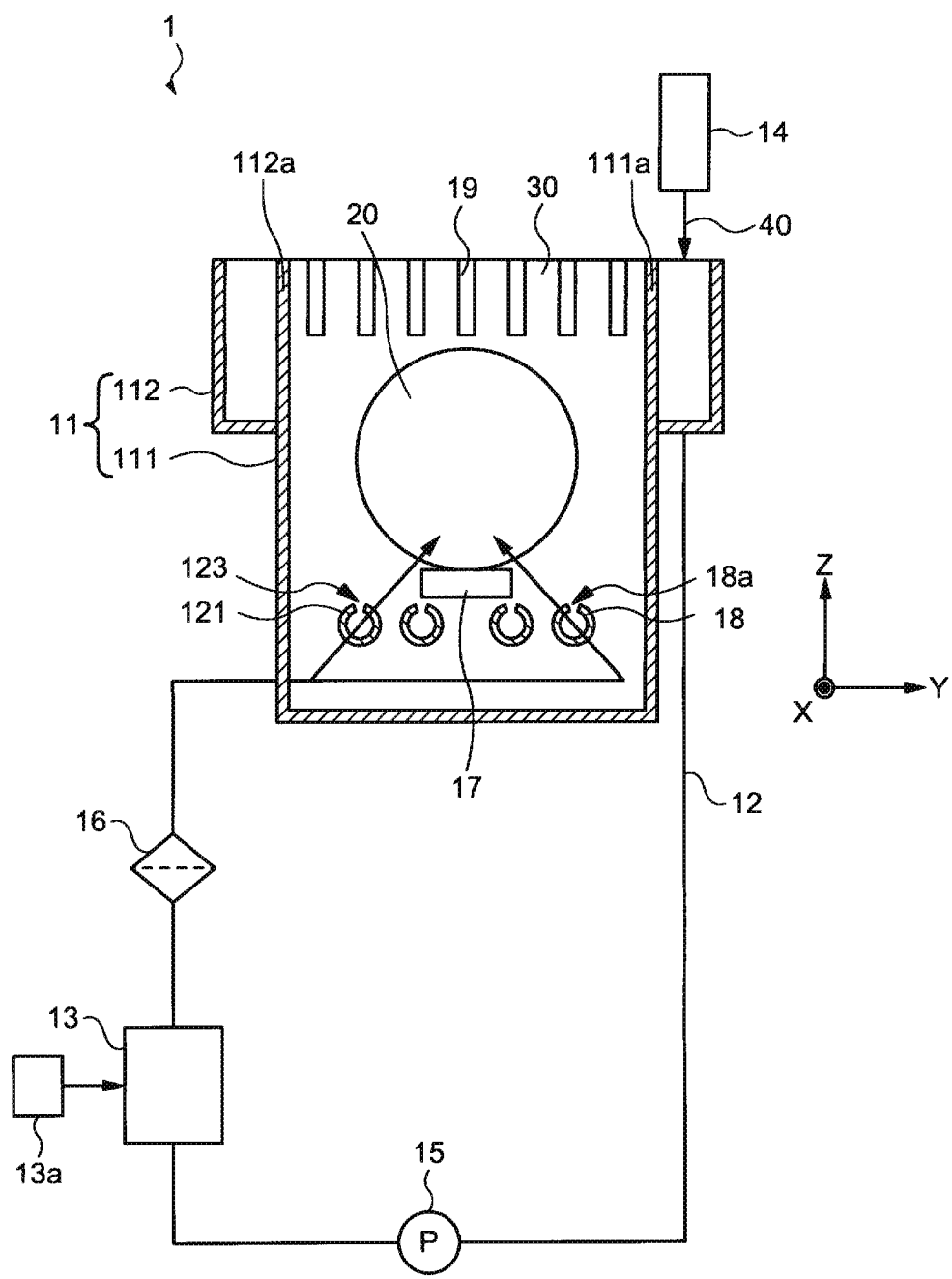
FIG. 1 depicts a substrate processing device according to an embodiment.

FIG. 1 is a diagram schematically illustrating an overall configuration of a substrate processing device according to an embodiment. A substrate processing device 1 is, for example, a wet etching processing device that removes a silicon nitride film provided on a substrate 20 with a solution containing phosphoric acid (phosphoric acid solution 30). As illustrated in FIG. 1, the substrate processing device 1 includes a processing tank 11, a circulation path 12, a heating unit 13, a feeding section 14, a pump 15, a filter 16, a holding member 17, a bubble discharge pipe 18, and a straightening vane 19.

The processing tank 11 is a container having an inner tank 111 and an outer tank 112. The inner tank 111 is formed in a box shape having an upper end opening 111a. The inner tank 111 stores the phosphoric acid solution 30 used as an etching solution (also referred to as a processing solution or a process solution) for a silicon nitride film. The temperature, phosphoric acid concentration, and silica concentration of the phosphoric acid solution 30 stored in the inner tank 111 can be optimized for etching the silicon nitride film provided on the substrate 20.

The inner tank 111 can accommodate a wafer substrate 20 ("substrate 20") disposed vertically (that is, the main surface of the substrate 20 is along a vertical direction in a YZ plane). For example, a maximum of 50 substrates 20 may be accommodated inside one inner tank 111. FIG. 1 illustrates just one substrate 20 in the inner tank 111, but a plurality of substrates 20 can be accommodated side by side in the depth direction (X direction) of the drawing page. When the substrate 20 is immersed in the phosphoric acid solution 30, the silicon nitride film on the substrate 20 is dissolved by the phosphoric acid solution 30 and thus removed from the substrate 20. Therefore, the inner tank 111 has a depth sufficient to completely immerse the vertically accommodated substrate 20 in the phosphoric acid solution 30. The upper end opening 111a of the inner tank 111 is higher than the upper end of the vertically accommodated substrate 20. The distance from the upper end opening 111a of the inner tank 111 to the upper end of the vertically accommodated substrate 20 is preferably 3 cm or more.

The outer tank 112 includes an upper end opening 112a that surrounds the upper end opening 111a of the inner tank 111 around its entire circumference. The outer tank 112 collects the phosphoric acid solution 30 overflowing from the upper end opening 111a of the inner tank 111.

The circulation path 12 connects the bottom of the outer tank 112 to the inner tank 111 to permit the phosphoric acid solution 30 to circulate to the processing tank 11. Specifically, in the circulation path 12, the phosphoric acid solution 30 flowing out to the outer tank 112 is refluxed back to the inner tank 111. In this process, the phosphoric acid solution 30 passes through the heating unit 13, the pump 15, and the filter 16.

The heating unit 13 is provided in the middle of the circulation path 12. The heating unit 13 heats the phosphoric acid solution 30. The heating unit 13 is, for example, a line heater using a halogen lamp as a heat source.

In the present embodiment, a heating control unit 13a adjusts the heating temperature of the heating unit 13 so that the phosphoric acid solution 30 is heated to a constant temperature. The heated phosphoric acid solution 30 that has been heated by the heating unit 13 is supplied to the inside of the inner tank 111 via the filter 16.

The feeding section 14 is disposed above the outer tank 112. The feeding section 14 feeds water to the outer tank 112. The concentration of the phosphoric acid solution 30 collected in the outer tank 112 may change over time due to the etching processing and also the evaporation of water in the inner tank 111. Therefore, water 40 can be fed from the feeding section 14 in order to adjust the concentration of the phosphoric acid solution 30 being refluxed to the inner tank 111 and thus the concentration of the of phosphoric acid solution 30 in the inner tank can be maintained at an optimum concentration for selective etching of the silicon nitride film.

In order to adjust the concentration, the feeding section 14 may feed phosphoric acid into the outer tank 112 instead of the water 40. Alternatively, the feeding section 14 may supply the outer tank 112 with a phosphoric acid solution already having the optimum concentration or otherwise a concentration for providing the inner tank 111 with the optimum concentration. In the present embodiment, it is generally desirable that the temperature of any supplied water, phosphoric acid, or phosphoric acid solution is lower than the ideal temperature of the phosphoric acid solution 30 stored in the inner tank 111 so that bumping does not occur in the outer tank 112.

The pump 15 is provided upstream of the heating unit 13 in the circulation path 12. When the pump 15 withdraws the phosphoric acid solution 30 from the outer tank 112, the phosphoric acid solution 30 moves to the heating unit 13. After heating, the phosphoric acid solution 30 is supplied to the inner tank 111.

The filter 16 is provided downstream of the heating unit 13 in the circulation path 12. The filter 16 removes particles contained in the phosphoric acid solution 30 travelling on the circulation path 12. These particles also contain, for example, silica dissolved in the phosphoric acid solution 30 during etching of the substrate 20. The filter 16 may instead or also be provided upstream of the heating unit 13 in the circulation path 12.

Figure 2:
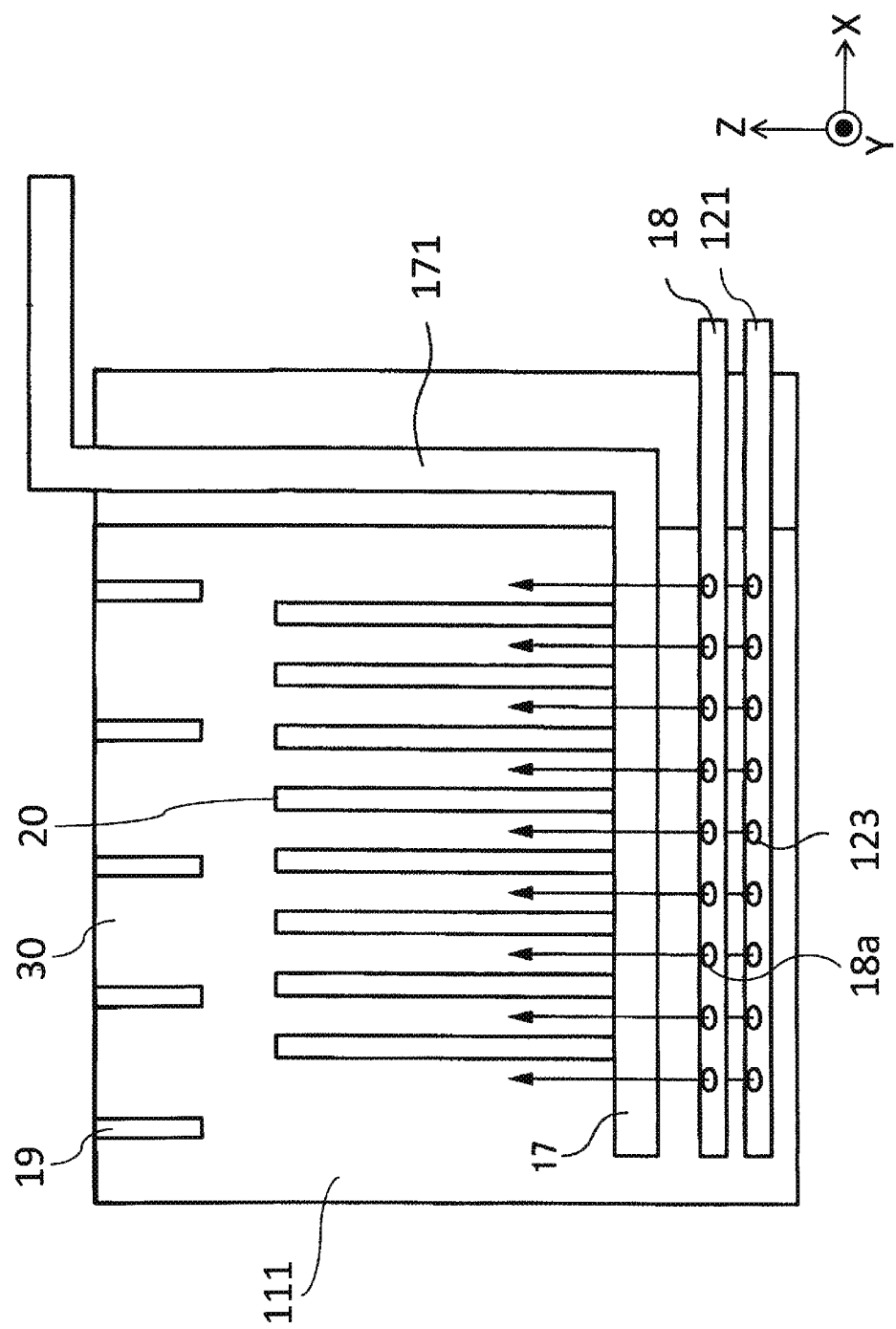
FIG. 2 is a schematic view illustrating an internal structure of an inner tank.

FIG. 2 is a schematic view illustrating the internal structure of the inner tank 111. As illustrated in FIG. 2, inside the inner tank 111, the holding member 17 holds a plurality of substrates 20 arranged along the horizontal direction (X direction) at predetermined intervals. The holding member 17 includes an elevating mechanism 171 that raises and lowers the substrate 20 in the vertical direction (Z direction). By the elevating operation of the elevating mechanism 171, the substrates 20 can be immersed in the phosphoric acid solution 30 stored in the inner tank 111, and then after the etching processing can be taken out from the inner tank 111.

As illustrated in FIG. 2, a chemical discharge pipe 121 is provided at the bottom of the inner tank 111. The chemical discharge pipe 121 is a part of the outlet side of the circulation path 12 and includes a chemical discharge port 123 that supplies the phosphoric acid solution 30 to the inner tank 111. Although FIG. 2 illustrates just one chemical discharge pipe 121, a plurality of chemical discharge pipes 121 can be provided side by side in Y direction along the bottom of the inner tank 111 or the like. The chemical discharge pipe 121 is disposed below the holding member 17. The chemical discharge pipe 121 extends in the direction (X direction) along which the plurality of substrates 20 are spaced.

The flow rate of the phosphoric acid solution 30 supplied from the chemical discharge pipe 121 is preferably 10 L/min or more for the inner tank 111. It is generally preferable that the chemical discharge pipes 121 are evenly arranged with respect to the substrates 20. In this case, each chemical discharge pipe 121 may supply the phosphoric acid solution 30 at substantially the same flow rate into the inner tank 111. However, the present embodiment is not limited thereto, and each chemical discharge pipe 121 may supply the phosphoric acid solution 30 at a different flow rate to the inner tank 111 depending on the arrangement of the substrates 20 and chemical discharge pipes 121.

As illustrated in FIG. 2, a bubble discharge pipe 18 is also provided at the bottom of the inner tank 111. The bubble discharge pipe 18 includes a bubble discharge port 18a that supplies bubbles (gas) to stir the phosphoric acid solution 30 in the inner tank 111. The bubbles supplied by the bubble discharge pipe 18 may contain, for example, nitrogen. Although FIG. 2 illustrates just one bubble discharge pipe 18, a plurality of bubble discharge pipes 18 can be provided side by side in Y direction.

The bubble discharge pipe 18 is disposed below the holding member 17. The bubble discharge pipe 18 and the chemical discharge pipe 121 may be disposed at the same height as one another, or the bubble discharge pipe 18 may be disposed above the chemical discharge pipe 121. When the bubble discharge pipe 18 is disposed above the chemical discharge pipe 121, it is preferable that the chemical discharge port(s) 123 does not overlap the bubble discharge pipe 18 in the vertical direction (Z direction). The bubble discharge pipe 18 extends in the X direction).

It is preferable that six or more bubble discharge pipes 18 are disposed in the inner tank 111. The flow rate of bubbles supplied from the bubble discharge pipe 18 is preferably 15 L/min or more for the inner tank 111. It is preferable that the bubble discharge pipes 18 are evenly arranged with respect to the substrates 20. In this case, each bubble discharge pipe 18 may supply bubbles having substantially the same flow rate. However, the present embodiment is not limited thereto, and each bubble discharge pipe 18 may supply bubbles having a different flow rate depending on the arrangement with respect to the substrates 20.

Figure 3:
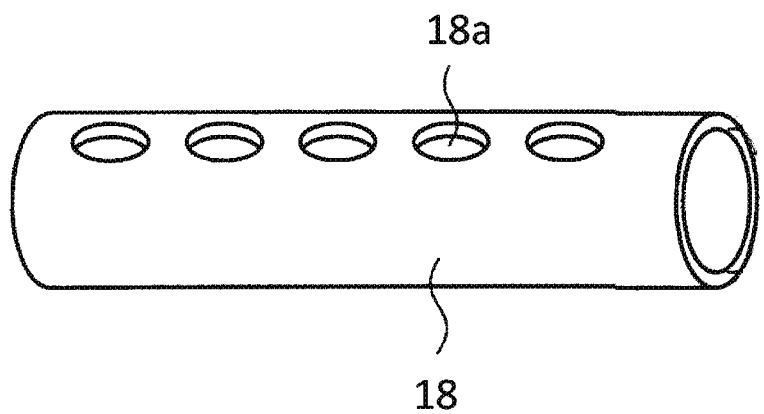
FIG. 3 is a perspective view schematically illustrating a structure of a chemical discharge pipe.

FIG. 3 is a perspective view schematically illustrating the structure of a bubble discharge pipe 18. The structure of the chemical discharge pipe 121 according to the present embodiment can be substantially same as the structure of the bubble discharge pipe 18, the structure of the bubble discharge pipe 18 will be described here representative of both. On the upper surface of the outer circumference of the bubble discharge pipe 18, a plurality of bubble discharge ports 18a communicating with the inside of the inner tank 111 are provided in a row. The bubble discharge ports 18a are arranged at substantially equal intervals in the X direction. The shape of the bubble discharge port 18a does not have to be a perfect circle. The number of bubble discharge ports 18a is preferably 60 or more for each substrate 20 (wafer). The number of bubble discharge ports 18a is, for example, preferably 3000 or more, and more preferably 3500 or more in the inner tank 111. Each bubble discharge port 18a disposed on a bubble discharge pipe 18 may supply bubbles at the same flow rate into the phosphoric acid solution 30.

By locating the bubble discharge port 18a and the chemical discharge port 123 in the above-described way, a flow of bubbles and the phosphoric acid solution 30 can be formed in which the bubbles supplied by the bubble discharge pipe 18 and the phosphoric acid solution 30 supplied by the chemical discharge pipe 121 pass between from bottom of the inner tank 111 and then between the substrate 20 (see the arrows in FIG. 2).

Further, as illustrated in FIG. 2, a straightening vane 19 is provided near the top of the inner tank 111. A two-phase uniform flow of gas and liquid in the phosphoric acid solution stored in the inner tank 111 is implemented with the straightening vane 19, by adjusting the flow formed by the bubbles supplied by the bubble discharge pipe 18 and the phosphoric acid solution 30 supplied by the chemical discharge pipe 121. The straightening vane 19 can be disposed directly on a substrate 20 being held by the holding member 17. In FIG. 2, the straightening vane 19 is completely immersed in the phosphoric acid solution 30 stored in the inner tank 111. However, the present embodiment is not limited thereto, and the straightening vane 19 may partially protrude from the upper surface of the phosphoric acid solution 30.

Figure 4:
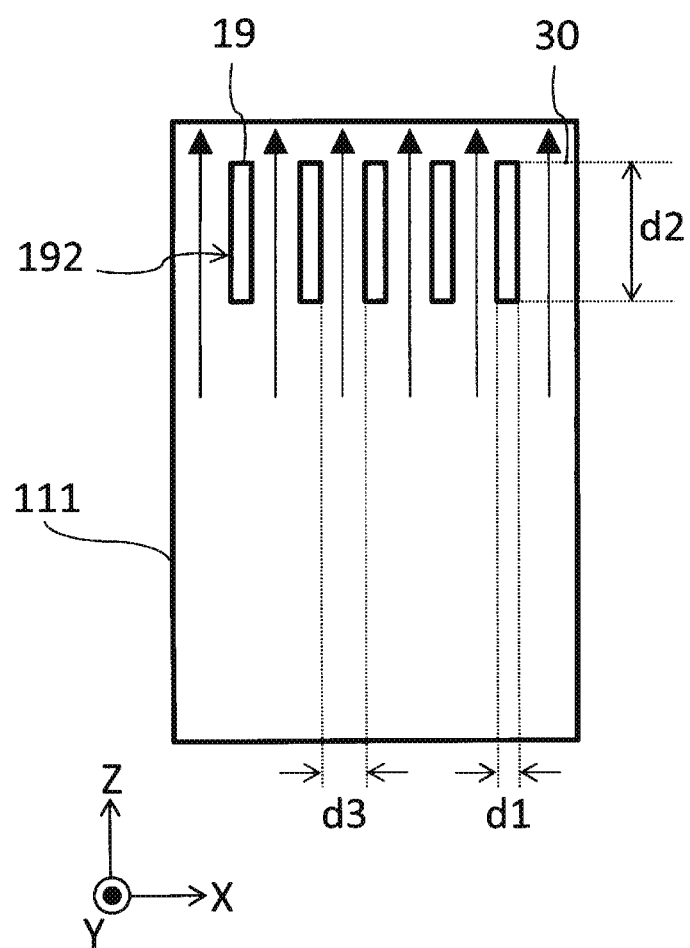
FIG. 4 is a cross-sectional view schematically illustrating a structure of a straightening vane.
Figure 5:
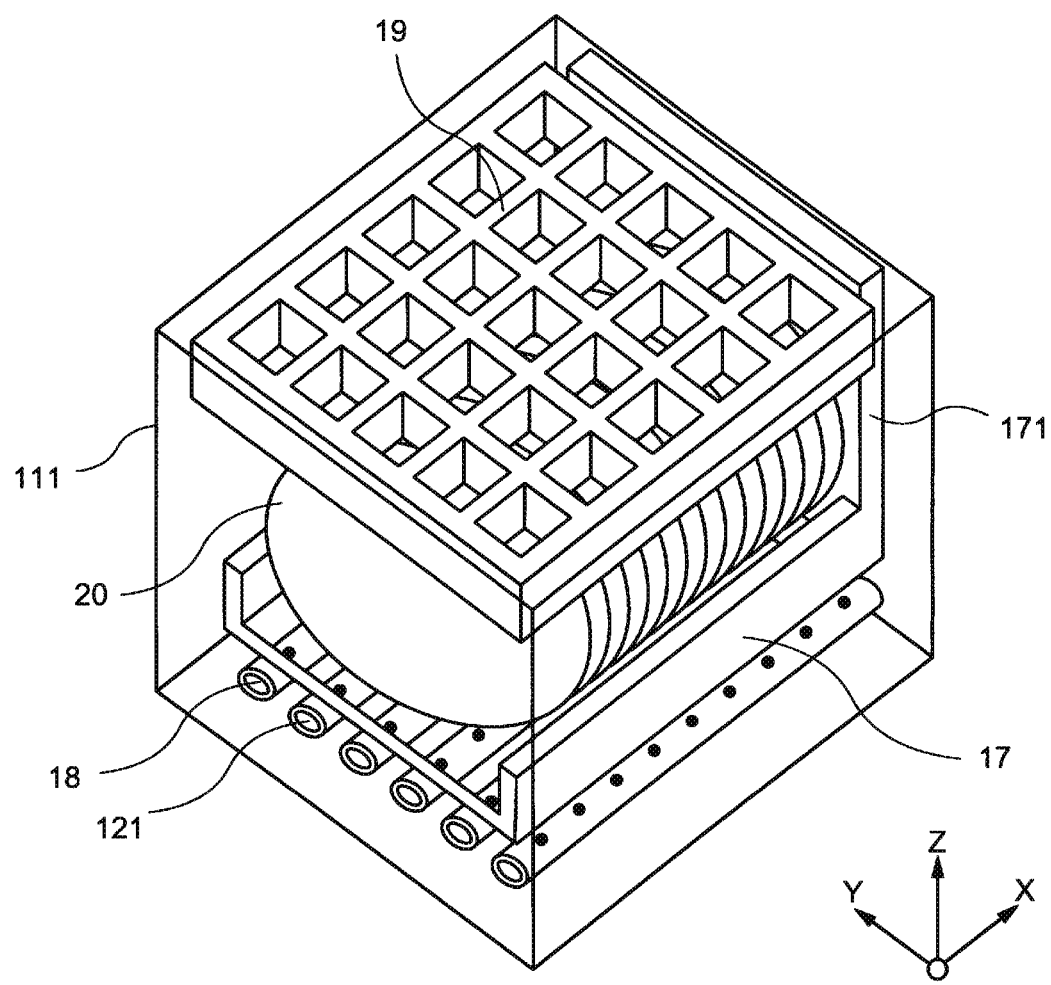
FIG. 5 is a perspective view schematically illustrating a structure of a straightening vane.

FIG. 4 is an XZ cross-sectional view in the direction in which the bubble discharge pipe extends, which schematically illustrates the structure of the straightening vane 19. FIG. 5 is a perspective view schematically illustrating the structure of the straightening vane 19. In the present embodiment, the straightening vane 19 comprises separated vane portions disposed is in a grid pattern. In this example, the structure in an XZ cross section and the structure in a YZ cross section are the same for the straightening vane 19 and the vane portions thereof. As such, the structure of the XZ cross section, depicted in FIG. 4, will be described as representative of both the XZ cross sectional structure and the YZ cross sectional structure. The straightening vane 19 includes vane portions that extend in the vertical direction (Z direction) parallel to each other and the vertical direction. However, the present embodiment is not limited thereto, and the straightening vane 19 may have vane portions which are angled with respect to the horizontal direction (X direction). That is, the cross section cut in the vertical direction (Z direction) with respect to a main surface 192 (YZ surface) of the straightening vane 19 is longer in the vertical direction (Z direction) than in the horizontal direction (X direction). A thickness d1 of a vane portion of the straightening vane 19 (distance in the horizontal direction (X direction) of the cross section cut in the vertical direction (Z direction) with respect to the main surface 192) is preferably 5 mm or less, for example. When the thickness d1 of the vane portion of the straightening vane 19 is 5 mm or less, it is possible to reduce the potential accumulation of bubbles under the straightening vane 19. A length d2 of the vane portions of the straightening vane 19 in the vertical direction (Z direction) is preferably 3 cm or more, for example. When the length d2 of the vane portions of the straightening vane 19 in the vertical direction (Z direction) is 3 cm or more, a two-phase uniform flow of gas and liquid can be implemented in the phosphoric acid solution 30 in the inner tank 111 in response to the flow formed by the bubbles supplied by the bubble discharge pipe(s) 18 and the phosphoric acid solution 30 supplied by the chemical discharge pipe(s) 121. The straightening vane 19 further extends in the horizontal direction (Y direction). The straightening vane 19 may be extended from one side of the inner tank 111 to the other side, for example. The length of the straightening vane 19 in the horizontal direction (Y direction) is not particularly limited. It suffices if the straightening vane 19 can fit in the inner tank 111.

As illustrated in FIGS. 4 and 5, the straightening vane 19 is configured with a plurality of plate-shaped members (vane portions). The plurality of plate-shaped members may be disposed substantially in parallel so as to extend from one side of the inner tank 111 to the other side facing each other, for example. The number of the plurality of plate-shaped members disposed substantially in parallel is preferably, for example, 5 or more. It is preferable that the plate-shaped members disposed substantially in parallel with one another are arranged at equal intervals. The distance d3 between the plate-shaped members disposed substantially in parallel with one another is preferably in the range of, for example, 10 mm to 60 mm.

A plurality of other plate-shaped members disposed substantially in parallel with one another may intersect with another plurality of plate-shaped members disposed substantially in parallel with one another. That is, the plurality of plate-shaped members (vane portions) may be disposed in a grid pattern in the horizontal plane direction (XY direction). The number of crossing plate-shaped members disposed substantially in parallel is preferably, for example, 5 or more. It is preferable that the distance between the adjacent plate-shaped members disposed in a grid pattern is in the range of 10 mm to 60 mm.

With the straightening vane 19 configured in this way, the bubbles supplied by the bubble discharge pipes 18 and the phosphoric acid solution 30 supplied by the chemical discharge pipes 121 can form a flow of the bubbles and the phosphoric acid solution 30 passing between the plurality of plate-shaped members (see arrow in FIG. 4). The bubbles supplied by the bubble discharge pipe 18 can be released from the phosphoric acid solution 30 via the straightening vane 19 and bubbled from the surface of the phosphoric acid solution 30 to prevent the substrates 20 from being left exposed from the phosphoric acid solution 30.

The substrate processing device 1 provides a two-phase uniform flow of gas and liquid in the inner tank 111 by the flow of the bubbles and the phosphoric acid solution 30, thereby improving the mixing efficiency of the phosphoric acid solution 30.

Second Embodiment

Figure 6:
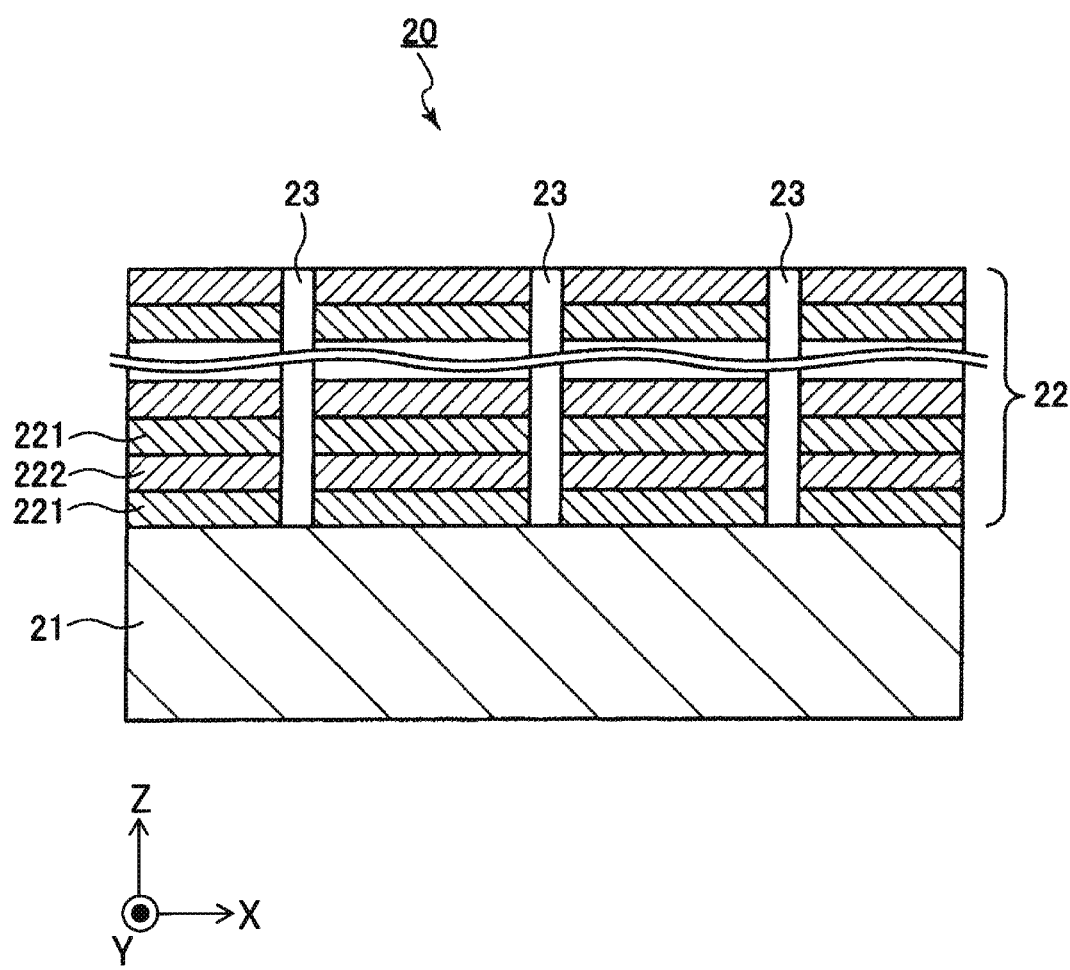
FIG. 6 is a cross-sectional view of a substrate to be etched.

A substrate processing method using the substrate processing device 1 will be described. FIG. 6 is a cross-sectional view of a substrate 20 to be etched. The substrate 20 is a semiconductor substrate being used in the manufacturing of a stacked memory device in which electrode layers are stacked on above the other along the Z direction.

As illustrated in FIG. 6, the substrate 20 includes a silicon substrate 21 and a stacked film 22. The stacked film 22 includes silicon oxide films 221 and silicon nitride films 222, alternately stacked. Further, the substrate 20 includes a trench 23 penetrating the stacked film 22.

When the substrate 20 is accommodated in the inner tank 111 by the holding member 17, the phosphoric acid solution 30 stored in the inner tank 111 penetrates into the stacked film 22 via the trench 23. As a result, the silicon nitride film 222 is removed (etched) by the phosphoric acid solution 30. During this processing, the silica concentration becomes high in the phosphoric acid solution 30. Eventually, an electrode layer is formed at a position from which the silicon nitride films 222 have been removed.

The phosphoric acid solution 30 overflowing from the inner tank 111 is collected in the outer tank 112. The phosphoric acid solution 30 collected in the outer tank 112 is sent to the heating unit 13 by the pump 15. The heating unit 13 heats the phosphoric acid solution 30. The phosphoric acid solution 30 that has been heated by the heating unit 13 is then discharged by the pump 15 into the inner tank 111 via the chemical discharge port 123 of the chemical discharge pipe 121. Bubbles are discharged into the inner tank 111 from the bubble discharge port 18a of the bubble discharge pipe 18. When the flow of the bubbles and the phosphoric acid solution 30 passes between the substrates 20 and then passes between the vane portions of straightening vane 19, a two-phase uniform flow of gas and liquid can be implemented in the phosphoric acid solution 30 stored in the inner tank 111.

When the amount of the silicon nitride film 222 dissolved in the phosphoric acid solution 30 increases, the amount of silica dissolved in the phosphoric acid solution 30 also increases. Therefore, silica is more likely to be deposited in the trench 23 or the like as particles or the like. On the other hand, if the silica concentration in the phosphoric acid solution is kept low, the etch selectivity of the silicon nitride films 222 with respect to the silicon oxide films 221 becomes lower, and the silicon oxide films 221 may be eroded. By making the phosphoric acid solution 30 in which the substrate 20 is immersed more uniform, the silica concentration in the phosphoric acid solution 30 can be controlled to be an appropriate value.

The substrate processing method using the substrate processing device 1 can improve the stirring efficiency of the phosphoric acid solution 30 by implementing a two-phase uniform flow of gas and liquid in the phosphoric acid solution 30 stored in the inner tank 111 by the flow of the bubbles and the phosphoric acid solution 30.

Modification Example 1

The configuration of a substrate processing device according to a modification example is the same as the configuration of the substrate processing device 1 according to the first embodiment except for certain aspects related to the straightening vane 19.

Figure 7A:
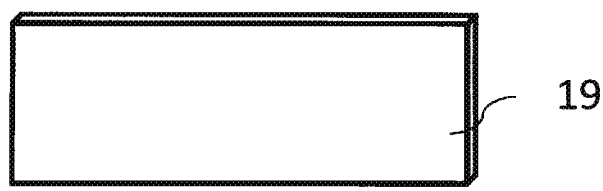
FIGS. 7A, 7B, and 7C are diagrams illustrating aspects of a straightening vane according to various examples.
Figure 7B:
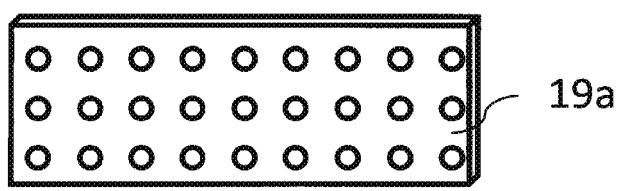
Figure 7C:
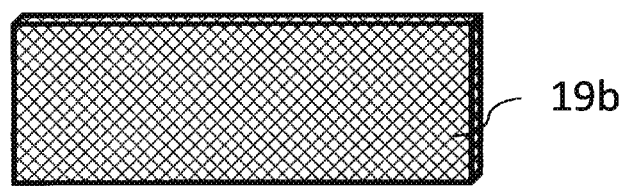

FIG. 7A is a diagram illustrating a part of a straightening vane 19 according to the first embodiment. FIGS. 7B and 7C are diagrams illustrating a straightening vane 19a and 19b, respectively, according to modification examples. As illustrated in FIG. 7A, the straightening vane 19 has a flat plate shape. However, the present disclosure is not limited thereto, and a straightening vane 19a may be porous as illustrated in FIG. 7B, and a straightening vane 19b may be a mesh structure as illustrated in FIG. 7C. The straightening vane 19a and the straightening vane 19b may have less cross-resistance to the flow formed by the bubbles supplied by the bubble discharge pipe 18 and the phosphoric acid solution 30 supplied by the chemical discharge pipe 121. The straightening vane 19a and the straightening vane 19b may be, for example, up to 90% holes (porous). When the holes of the straightening vane 19a and the straightening vane 19b can be set to 90% or less porous according to the flow formed by the bubbles supplied by the bubble discharge pipe 18 and the phosphoric acid solution 30 supplied by the chemical discharge pipe 121 for implementing a two-phase uniform flow of gas and liquid in the inner tank 111. That is, the porosity or the like of straightening vane 19a and the straightening vane 19b can be selected to provide optimal flow.

Modification Example 2

The configuration of the substrate processing device according to the present modification example is the same as the configuration of the substrate processing device 1 according to the first embodiment except for the structure of the straightening vane 19.

Figure 8:
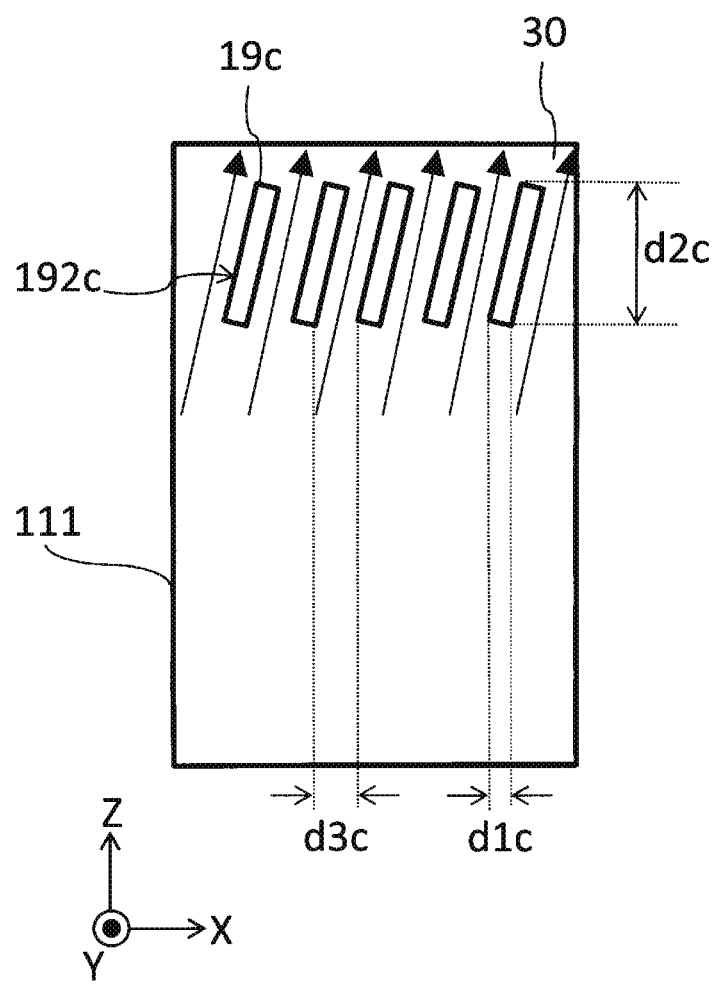
FIG. 8 is a cross-sectional view schematically illustrating a structure of a straightening vane according to a modification example.

FIG. 8 is an XZ cross-sectional view, which schematically illustrates the structure of the straightening vane 19c according to another modification example. In this modification example, since a straightening vane 19c is in a grid pattern, and the structure of the XZ cross section and the structure of the YZ cross section are the same, in FIG. 8, the structure of the XZ cross section will be described as an example. The straightening vane 19c is angled toward the horizontal direction (X direction) rather than being parallel to the vertical direction (Z direction). The cross section of the straightening vane 19c cut in the vertical direction (Z direction) with respect to a main surface 192c (YZ surface) is longer in the vertical direction (Z direction) than in the horizontal direction (X direction). A thickness d1c of the straightening vane 19c (distance in the horizontal direction (X direction) of the cross section cut in the vertical direction (Z direction) with respect to the main surface 192c) is preferably 5 mm or less, for example. When the thickness d1c of the straightening vane 19c is 5 mm or less, it is possible to reduce the accumulation of bubbles under the straightening vane 19c. A length d2c of the straightening vane 19c in the vertical direction (Z direction) is preferably 3 cm or more, for example. When the length d2c of the straightening vane 19c in the vertical direction (Z direction) is 3 cm or more, a two-phase uniform flow of gas and liquid can be implemented in the phosphoric acid solution 30 stored in the inner tank 111. The straightening vane 19c extends in the horizontal direction (Y direction). The straightening vane 19c may be extended from one side of the inner tank 111 to the other side, for example. The length of the straightening vane 19c in the horizontal direction (Y direction) is not particularly limited. It suffices if the straightening vane 19 can fit in the inner tank 111.

The straightening vane 19c in a grid pattern and composed of a plurality of plate-shaped members (vane portions). The plurality of plate-shaped members may be disposed substantially in parallel so as to extend from one side of the inner tank 111 to the other side facing each other, for example. It is preferable that the plurality of plate-shaped members extending in the Y-direction in parallel with each other all be angled in the same direction. For the plurality of plate-shaped members of the grid pattern extending in the X-direction in parallel with each other be disposed substantially in parallel with each other and intersect with the plurality of plate-shaped members. That is, the plurality of plate-shaped members may be disposed in a grid pattern in the horizontal plane direction (XY direction). It is preferable that the number plate-shaped members disposed substantially in parallel with each other is in each grid pattern be, for example, 5 or more. It is preferable that the adjacent plate-shaped members be arranged at equal intervals. The distance between the adjacent plate-shaped members is preferably in the range of, for example, 10 mm to 60 mm. With the straightening vane 19c configured in this way, the bubbles supplied by the bubble discharge pipe 18 and the phosphoric acid solution 30 supplied by the chemical discharge pipe 121 pass between the plurality of straightening vanes 19c from the bottom of the inner tank 111 to form a flow of the bubbles and the phosphoric acid solution 30, and bubbles can be released from the phosphoric acid solution 30 through the straightening vane 19 (see the arrows in FIG. 8). The bubbles supplied by the bubble discharge pipe 18 can be released from the phosphoric acid solution 30 after passing the straightening vane 19c and bubbled at the surface of the phosphoric acid solution 30 to prevent the substrates 20 from being exposed from the phosphoric acid solution 30.

The substrate processing device according to this present modification example provides a two-phase uniform flow of gas and liquid in the phosphoric acid solution 30.

Modification Example 3

The configuration of the substrate processing device according to this third modification example is the same as the configuration of the substrate processing device according to the first embodiment, except that the straightening vane 19 is provided with an elevating mechanism.

Figure 9A:
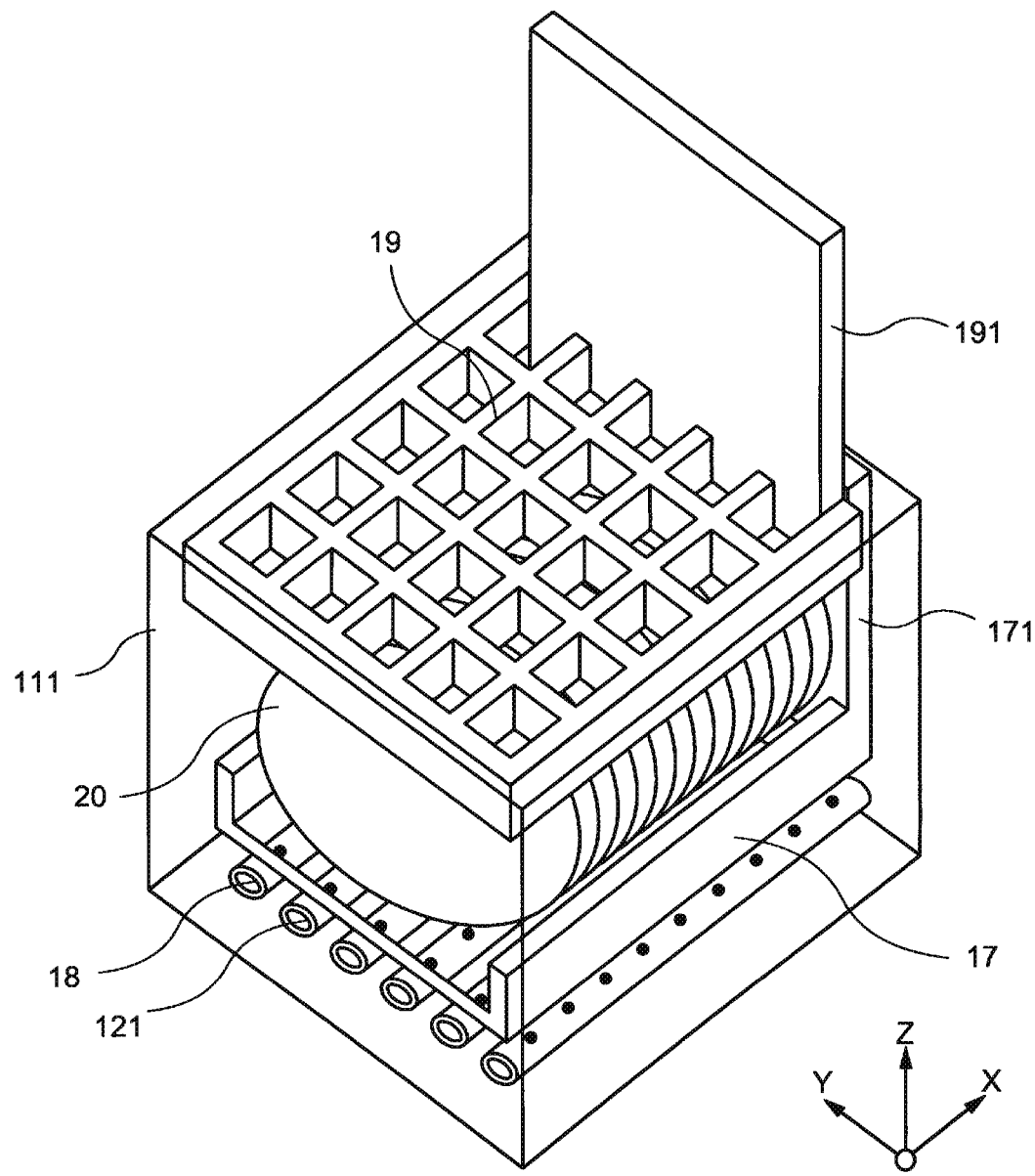
FIG. 9A is a perspective view schematically illustrating a structure of a straightening vane according to a modification example.
Figure 9B:
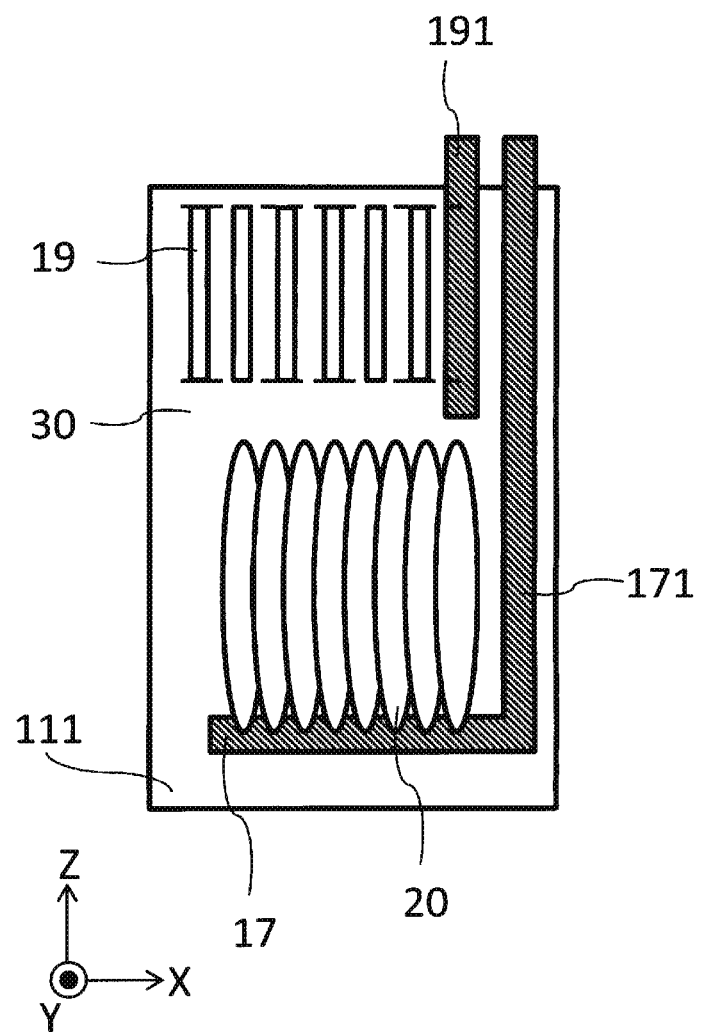
FIG. 9B is a cross-sectional view schematically illustrating a structure of a straightening vane according to a modification example.

FIG. 9A is a perspective view schematically illustrating the structure of the straightening vane 19 according to this modification example. FIG. 9B is an XZ cross-sectional view in the direction in which the substrates are arranged, which schematically illustrating the structure of the straightening vane 19 according to this modification example. In this third modification example, the straightening vane 19 includes an elevating mechanism 191. By the operation of the elevating mechanism 191, the straightening vane 19 can be immersed in the phosphoric acid solution 30 of the inner tank 111, and removed from the inner tank 111 when the substrate 20 is being carried in and out of the inner tank 111 before and after the etching processing.

Modification Example 4

The configuration of the substrate processing device according to this modification example is the same as the configuration of the substrate processing device 1 according to the first embodiment, except that the straightening vane 19 is integrated with a lid 193.

Figure 10A:
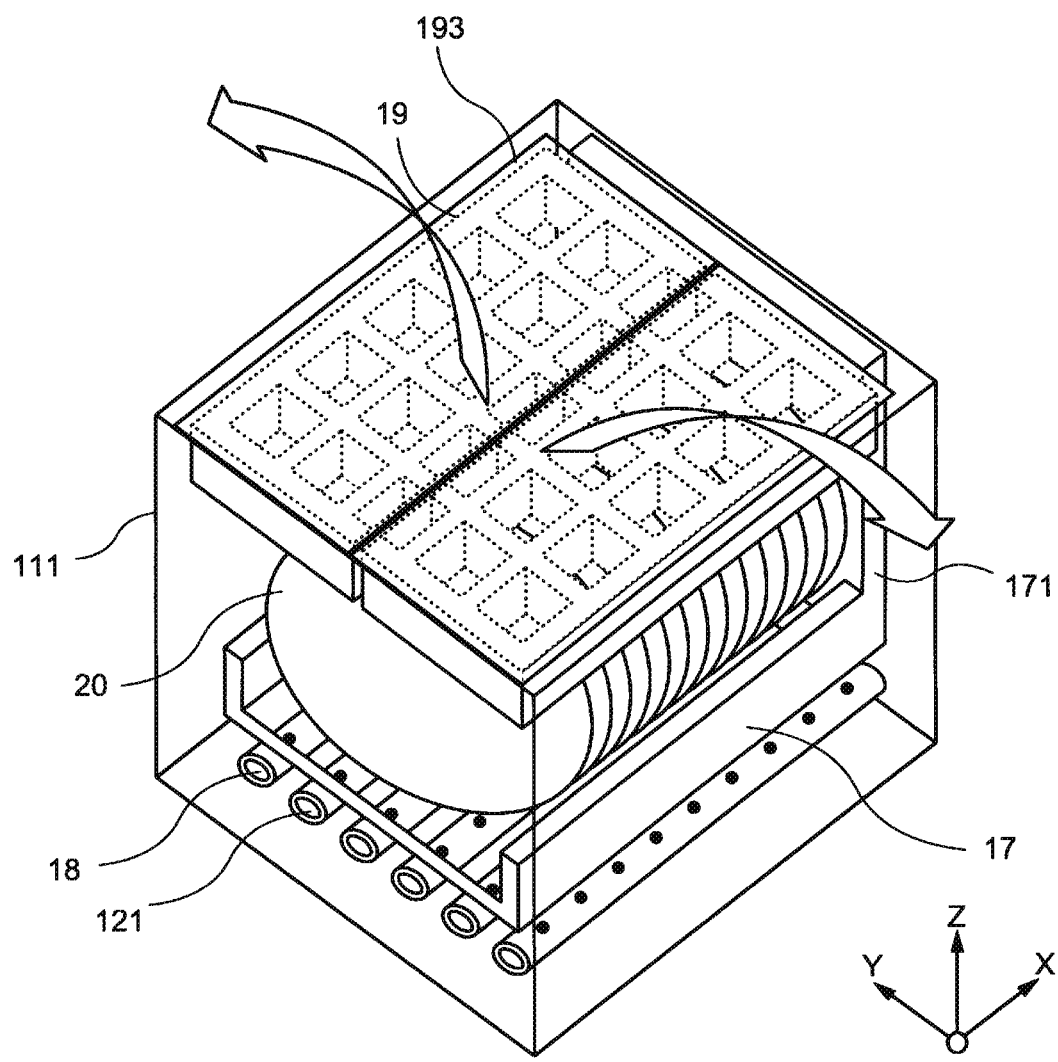
FIG. 10A is a perspective view schematically illustrating a structure of a straightening vane according to a modification example.
Figure 10B:
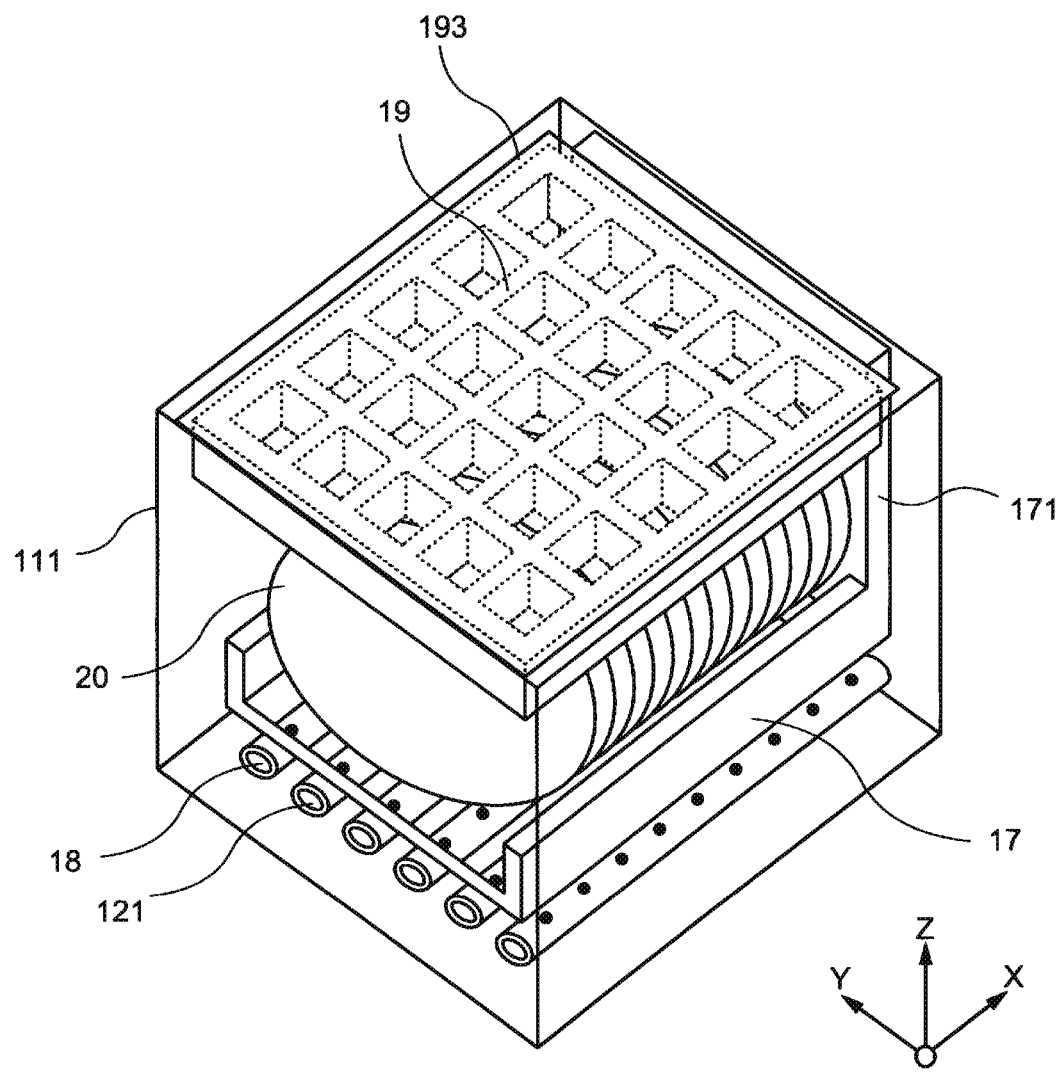
FIG. 10B is a perspective view schematically illustrating a structure of a straightening vane according to a modification example.
Figure 10C:
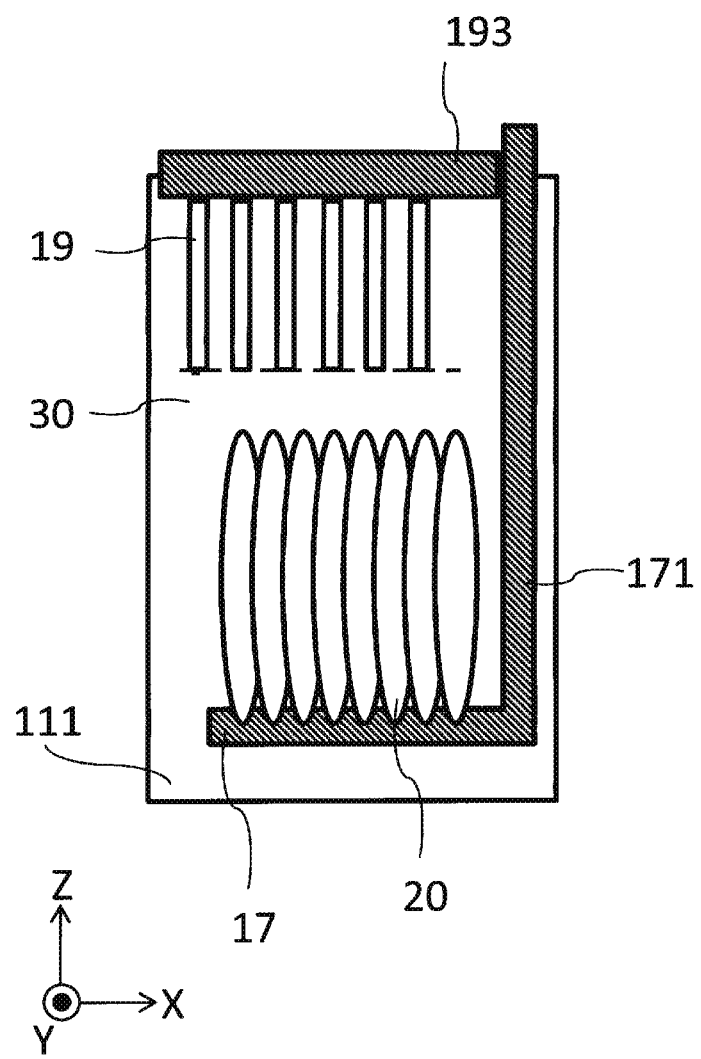
FIG. 10C is a cross-sectional view schematically illustrating a structure of a straightening vane according to a modification example.

FIG. 10A is a perspective view schematically illustrating the structure of the straightening vane 19 according to this modification example. FIG. 10B is a perspective view schematically illustrating the structure of the straightening vane 19 according to this modification example. FIG. 10C is an XZ cross-sectional view schematically illustrating the structure of the straightening vane 19 according to this third modification example. The straightening vane 19 is integrated with a lid 193. As illustrated in FIG. 10A, the lid 193 may be a double-sided opening type in which the left and right ends are fixed, which rotates left and right from the center to open and close, or as illustrated in FIG. 10B, may be a single-sided opening type in which one end is fixed, which rotates from the opposite end to one end to open and close. By closing the lid 193, the straightening vane 19 can be fully immersed in the phosphoric acid solution 30 stored in the inner tank 111, and by opening the lid 193, the straightening vane 19 can be taken out from the inner tank 111 when the substrate 20 is being carried in and out before and after the etching processing. In other examples, the lid 193 may be fully removable instead opening and closing on a fixed hinge or the like. In this case, by attaching the lid 193, the straightening vane 19 can be immersed in the phosphoric acid solution 30 stored in the inner tank 111, and by removing the lid 193, the straightening vane 19 can be taken out from the inner tank 111 when the substrate 20 is being carried in and out before and after the etching processing.

Modification Example 5

The configuration of the substrate processing device according to the fifth modification example is the same as the configuration of the substrate processing device 1 according to the first embodiment, except that the straightening vane is foldable or collapsible.

Figure 11A:
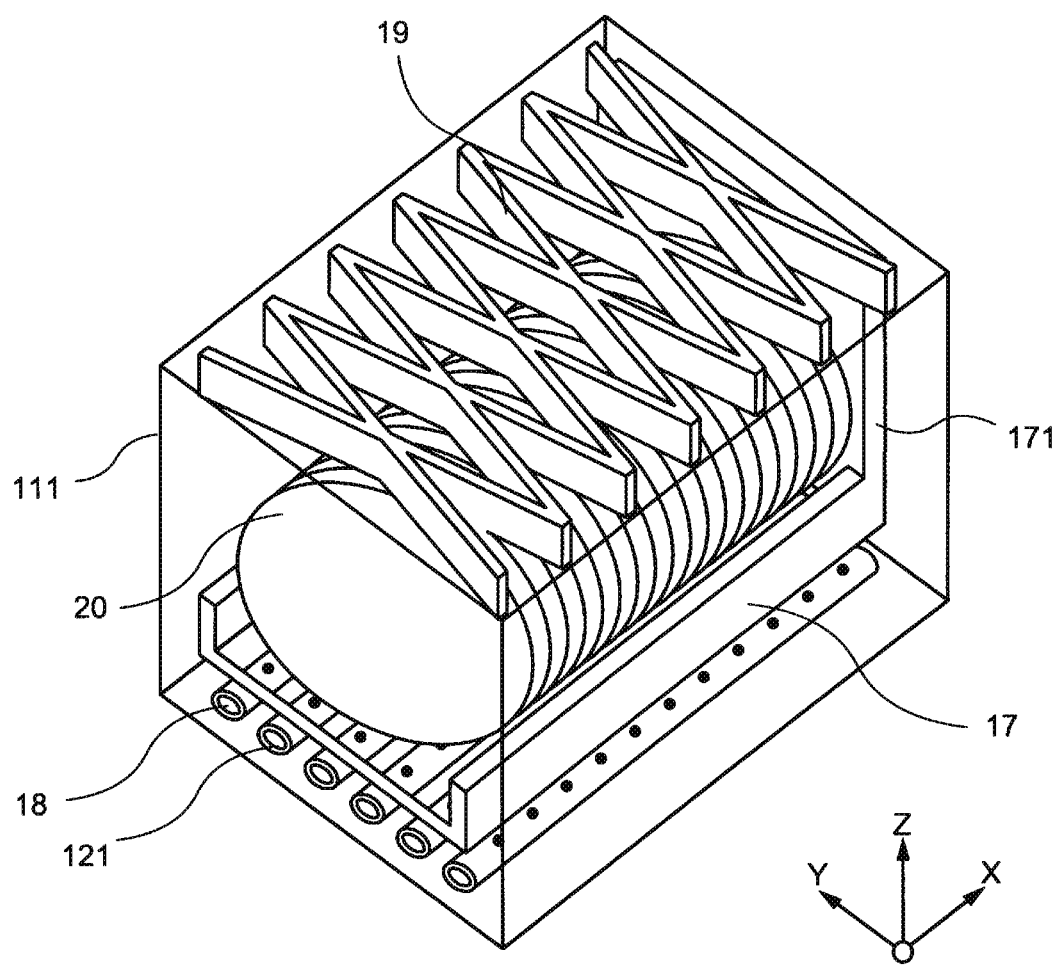
FIG. 11A is a perspective view schematically illustrating a structure of a straightening vane according to a modification example.
Figure 11B:
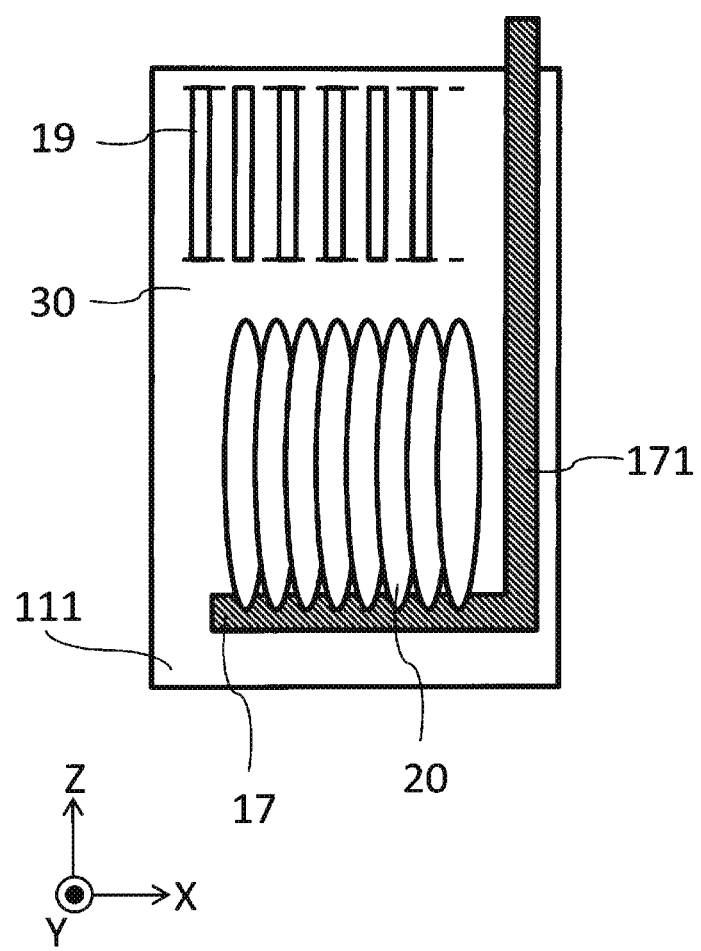
FIG. 11B is a cross-sectional view schematically illustrating a structure of a straightening vane according to a modification example.
Figure 12A:
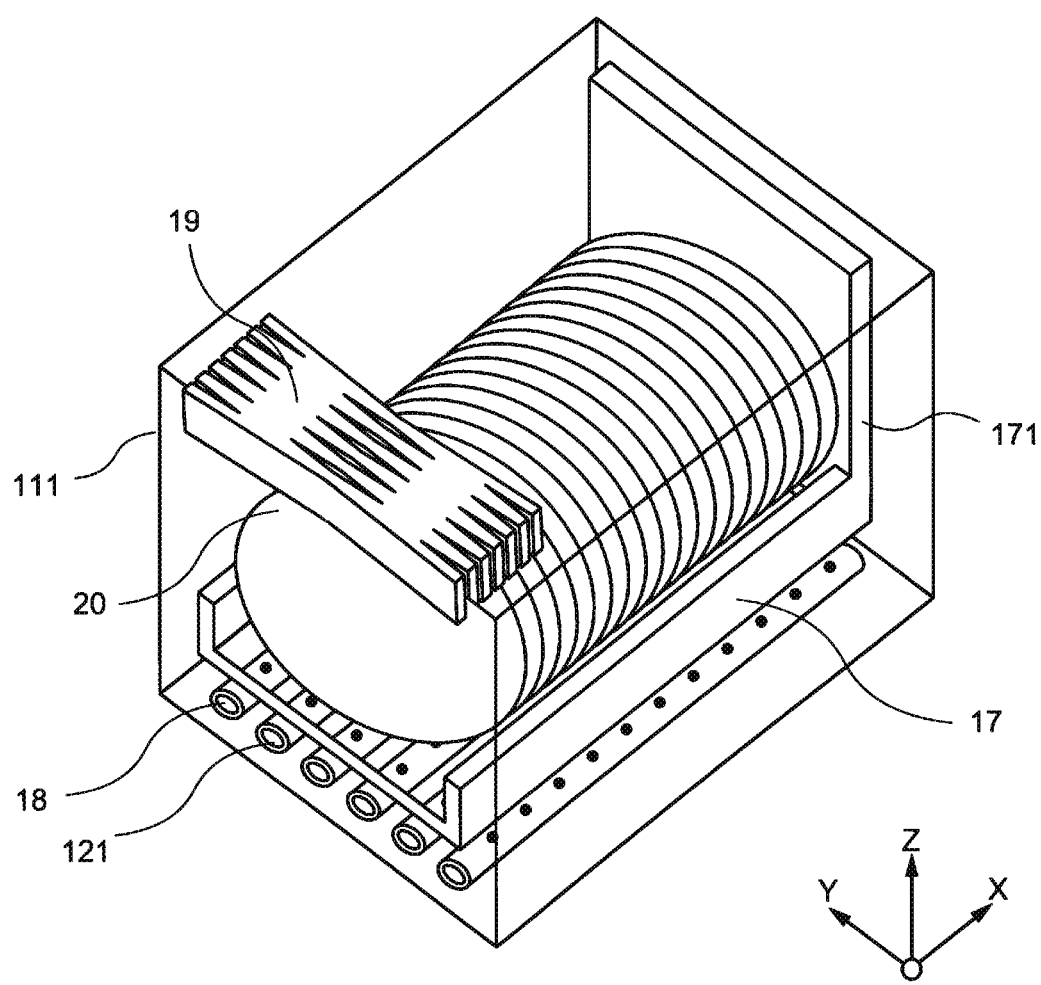
FIG. 12A is a perspective view schematically illustrating a structure of a straightening vane according to a modification example.
Figure 12B:
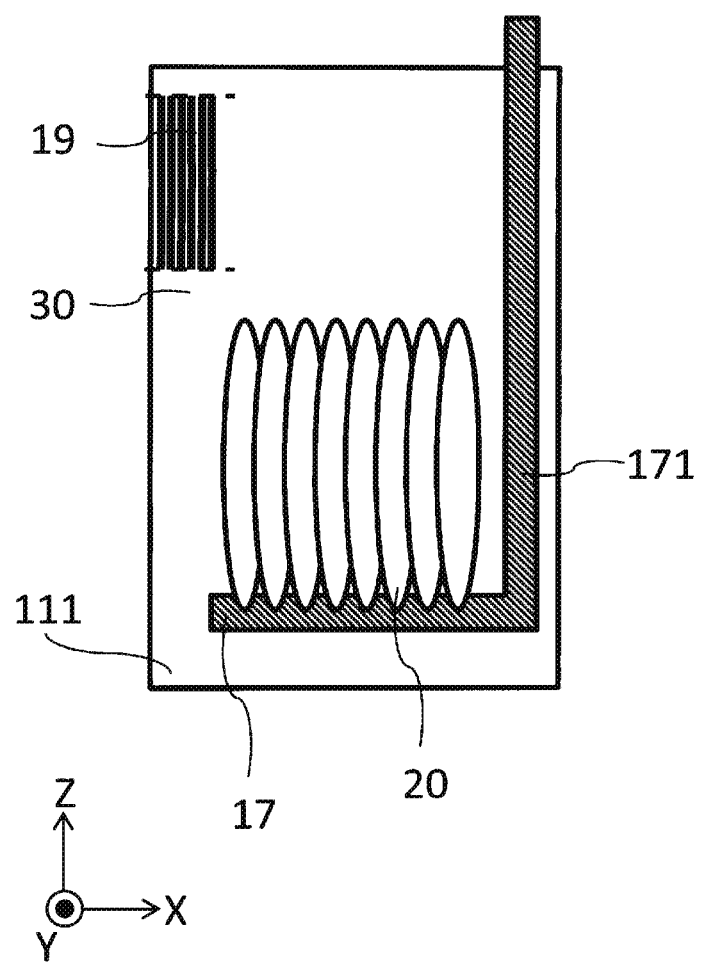
FIG. 12B is a cross-a view schematically illustrating a structure of a straightening vane according to a modification example.

FIG. 11A is a perspective view schematically illustrating the structure of the straightening vane according to the fifth modification example during the etching processing. FIG. 11B is an XZ cross-sectional view, which schematically illustrates the structure of the straightening vane 19 during the etching processing according to this modification example. FIG. 12A is a perspective view schematically illustrating the structure of the straightening vane 19 according to this modification at time example before or after the etching processing (that is, when the straightening vane 19 is folded). FIG. 12B is an XZ cross-sectional view which schematically illustrates the structure of the straightening vane according to this modification example before or after the etching processing (that is, when the straightening vane 19 is folded). In this modification example, the straightening vane 19 can be folded or collapsed upon itself to take up less space. The straightening vane 19 illustrated in FIGS. 11A and 11B can be folded so that the straightening vane 19 is brought close to one side of the inner tank 111 when the substrate 20 illustrated in FIGS. 12A and 12B is being carried in and out before and after the etching processing.

Modification Example 6

The configuration of the substrate processing device according to the sixth modification example is the same as the configuration of the substrate processing device 1 according to the first embodiment except for aspects related to the configuration of the chemical discharge pipe 121.

FIG. 13 is a YZ cross-sectional view, which schematically illustrates the structure of the chemical discharge pipe 121 according to this modification example. In the present modification example, the total number of chemical discharge pipes 121 is increased. By increasing the number of the chemical discharge pipes 121, it is possible to reduce the flow rate of the phosphoric acid solution 30 supplied from each individual chemical discharge pipe 121. By reducing the flow rate of the phosphoric acid solution 30 supplied from each chemical discharge pipe 121, it is possible to prevent the phosphoric acid solution 30 from exiting a chemical discharge pipe 121 with high flow velocity or concentrating at a specific portion of the inner tank 111 or the like.

Modification Example 7

The configuration of the substrate processing device according to the seventh modification example is the same as the configuration of the substrate processing device 1 according to the first embodiment except for the structure of the chemical discharge pipe 121.

Figure 14:
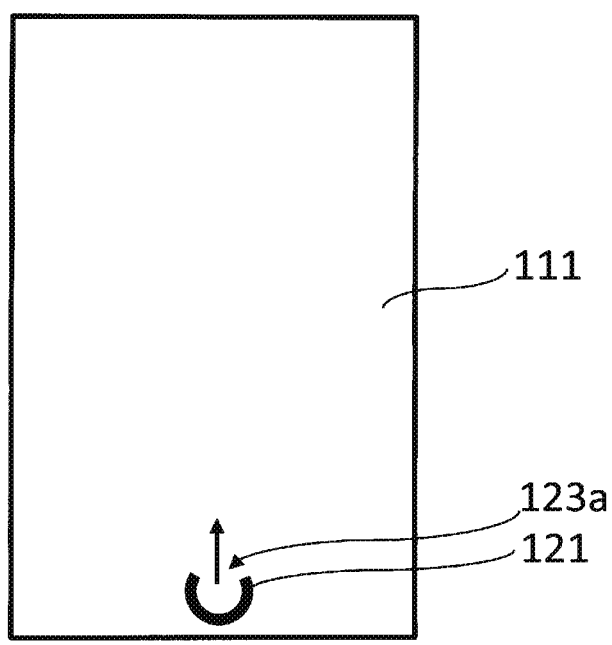
FIG. 14 is a cross-sectional view schematically illustrating a chemical discharge pipe according to a modification example.

FIG. 14 is a YZ cross-sectional view, which schematically illustrates the structure of the chemical discharge pipe 121 according to this seventh modification example. In this modification example, a chemical discharge port 123a of a chemical discharge pipe 121 has a relatively large diameter. The pore diameter of the chemical discharge port 123a may be, for example, 2 mm or more. The shape of the chemical discharge port 123a does not have to be a perfect circle. The chemical discharge port 123a may be a groove or slot shape, for example. Since the chemical discharge port 123a is larger, the flow velocity of the phosphoric acid solution 30 supplied from each chemical discharge port 123a can be reduced. By relaxing the concentration of the flow velocity of the phosphoric acid solution 30 supplied from each chemical discharge port 123a, it is possible to prevent phosphoric acid solution 30 with high flow velocity from concentrating at a specific position in the inner tank 111.

Modification Example 8

The configuration of the substrate processing device according to the eighth modification example is the same as the configuration of the substrate processing device 1 according to the first embodiment except for the structure of the chemical discharge pipe 121.

FIG. 15 is a YZ cross-sectional view in which schematically illustrates the structure of a chemical discharge pipe 123b according to this modification example. In this eighth modification example, the number of chemical discharge ports 123b in the chemical discharge pipe 121b is increased as compared to the number of chemical discharge ports 123 in the chemical discharge pipe 121 in the first embodiment. In order to increase the number of chemical discharge ports 123b, the chemical discharge ports 123b may be provided at point on the entire outer circumference of the chemical discharge pipe 121b, for example. Since the number of the chemical discharge ports 123b is larger, the supply of the phosphoric acid solution 30 can be dispersed, and the concentration of the flow velocity of the phosphoric acid solution 30 supplied from each chemical discharge port 123b can be relaxed as compared to the first embodiment. By relaxing the concentration of the flow velocity of the phosphoric acid solution 30 supplied from one chemical discharge port 123b, it is possible to prevent phosphoric acid solution 30 with a high flow velocity from concentrating at a specific position of the inner tank 111.

Modification Example 9

The configuration of the substrate processing device according to the ninth modification example is the same as the configuration of the substrate processing device 1 according to the first embodiment except that a partition wall 125 is further provided.

Figure 16:
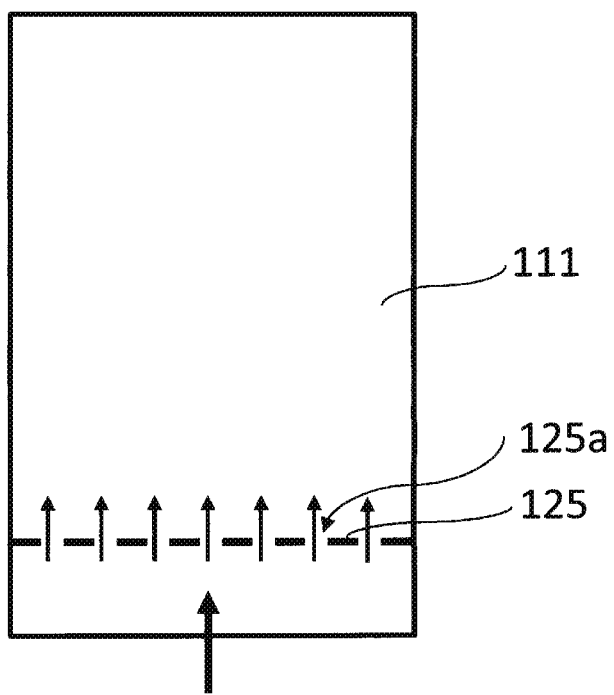
FIG. 16 is a cross-sectional view schematically illustrating a partition wall according to a modification example.

FIG. 16 is a YZ cross-sectional view, which schematically illustrates the structure of the partition wall 125 according to this modification example. As illustrated in FIG. 16, a partition wall 125 is provided at the bottom of the inner tank 111. The partition wall 125 is disposed below the holding member 17. The partition wall 125 is disposed above the chemical discharge pipe(s) 121. The partition wall 125 may be disposed above the bubble discharge pipe 18, but is preferably disposed below the bubble discharge pipe(s) 18. The partition wall 125 includes a large number of holes 125a therein, through which the phosphoric acid solution 30 supplied from the chemical discharge pipe 121 can pass. By providing the partition wall 125, the supply of the phosphoric acid solution 30 can be further dispersed, and the concentration of the flow velocity of the phosphoric acid solution 30 supplied from the chemical discharge pipes 121 can be relaxed.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A substrate processing device, comprising:
    a processing tank to store a liquid and to permit a plurality of substrates to be immersed in the liquid at the same time, the processing tank having an internal space in which the liquid is stored;
    a holder member configured to hold the plurality of substrates within the internal space with the substrates being spaced from one another in a first direction with main surfaces of the substrates being perpendicular to the first direction when the substrates are immersed in the liquid in the processing tank;
    a straightening vane configured to be positioned in the liquid in the internal space to be above the substrates in the processing tank in a second direction perpendicular to the first direction, the straightening vane including a plurality of vane portions, each vane portion extending in the second direction into the processing tank and in a third direction perpendicular to the first and second directions, each vane portion having a length in the second direction that is greater than a cross sectional width of the respective vane portion in the first direction; and
    a bubble discharge pipe in the processing tank below the holder member in the second direction, the bubble discharge pipe configured to discharge gas into the liquid in the internal space of the processing tank, wherein
    the straightening vane is foldable to clear a region above the holder in the second direction to allow the holder member to be inserted into the internal space.

2. The substrate processing device according to claim 1, further comprising:
    a chemical discharge pipe in the processing tank below the holder member in the second direction, the chemical discharge pipe configured to discharge liquid into the processing tank.

3. The substrate processing device according to claim 2, wherein the chemical discharge pipe includes at least 60 chemical discharge ports for each substrate in the plurality of substrates.

4. The substrate processing device according to claim 3, wherein each chemical discharge port has a pore diameter of at least 2 mm.

5. The substrate processing device according to claim 1, further comprising:
    a plurality of bubble discharge pipes in the processing tank below the holder member in the second direction, each bubble discharge pipe configured to discharge gas into the liquid in the processing tank.

6. The substrate processing device according to claim 1, wherein the bubble discharge pipe is configured to discharge gas at a rate of at least 15 L/min.

7. The substrate processing device according to claim 1, further comprising:
    an elevating mechanism connected to the straightening vane and configured to immerse the straightening vane into the liquid in the processing tank and to withdraw the straightening vane from the liquid in the processing tank.

8. The substrate processing device according to claim 1, wherein the vane portions are angled downwards in second direction with distance along the third direction away from a centerline of the straightening vane.

9. The substrate processing device according to claim 1, wherein the vane portions are porous.

10. The substrate processing device according to claim 1, wherein the vane portions are a mesh material.

11. The substrate processing device according to claim 1, further comprising:
    a lid configured to cover the processing tank, the lid being openable and closable to permit the holder member to be inserted into and withdrawn from the processing tank.

12. The substrate processing device according to claim 1, further comprising:
    an elevating mechanism configured to move the holder member up and down along the second direction.

13. The substrate processing device according to claim 1, wherein, when the plurality of substrates are immersed in the liquid, the straightening vane is positioned to avoid any overlap with the plurality of substrates when viewed along the first direction.

14. The substrate processing device according to claim 13, wherein, the straightening vane is further positioned to avoid any overlap with the plurality of substrates when viewed along the third direction.

15. The substrate processing device according to claim 1, wherein
    the plurality of vane portions includes a plurality of first vane portions and a plurality of second vane portions,
    each of the first vane portions intersects with a corresponding one of the second vane portions near a centerline of the straightening vane parallel to the first direction, and
    when the straightening vane is folded, intervals between adjacent first vane portions and adjacent second vane portions are reduced.

16. The substrate processing device according to claim 1, wherein the straightening vane compresses along the first direction when folded.

* * * * *